(12) United States Patent
Isshiki

(10) Patent No.: US 8,777,379 B2
(45) Date of Patent: Jul. 15, 2014

(54) LIQUID EJECTING HEAD, LIQUID EJECTING APPARATUS, AND PIEZOELECTRIC ELEMENT

(71) Applicant: Seiko Epson Corporation, Tokyo (JP)

(72) Inventor: Tetsuya Isshiki, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/644,138

(22) Filed: Oct. 3, 2012

(65) Prior Publication Data

US 2013/0088549 A1 Apr. 11, 2013

(30) Foreign Application Priority Data

Oct. 5, 2011 (JP) .................................. 2011-221358
Oct. 21, 2011 (JP) .................................. 2011-232281

(51) Int. Cl.
*B41J 2/045* (2006.01)
(52) U.S. Cl.
USPC .......................................................... 347/68
(58) Field of Classification Search
None
See application file for complete search history.

(56) References Cited

FOREIGN PATENT DOCUMENTS

| EP | 2 145 975 | | 1/2010 |
| EP | 2 301 903 | | 3/2011 |
| EP | 2301903 | A1 * | 3/2011 |
| JP | 2001-223404 | | 8/2001 |
| JP | 2010-016010 | | 1/2010 |

OTHER PUBLICATIONS

Extended European Search Report for Application No. EP 12 18 7450 dated Jan. 30, 2013 (8 pages).
Anamol Gautam et al., "Influence of Ti on Multiferroic Properties of Bi0.8Ba0.2Fe1-xTixO3 Ceramics", International Symposium on Applications of Ferroelectrics and International Symposium on Piezoresponse Force Microscopy and Nanoscale Phenomena in Polar Materials (ISAF/PFM), 2011, IEEE, Jul. 24, 2011, pp. 1-4.

* cited by examiner

*Primary Examiner* — Matthew Luu
*Assistant Examiner* — Erica Lin
(74) *Attorney, Agent, or Firm* — Harness, Dickey & Pierce, P.L.C.

(57) ABSTRACT

A liquid ejecting head includes a piezoelectric element having a first electrode, a piezoelectric body layer, and a second electrode, in which the piezoelectric body layer is formed of complex oxide of a pevroskite structure including at least bismuth, barium, iron, and titanium, and the mole ratio of titanium to barium (Ti/Ba) is 1.17 or more, and 1.45 or less.

4 Claims, 11 Drawing Sheets

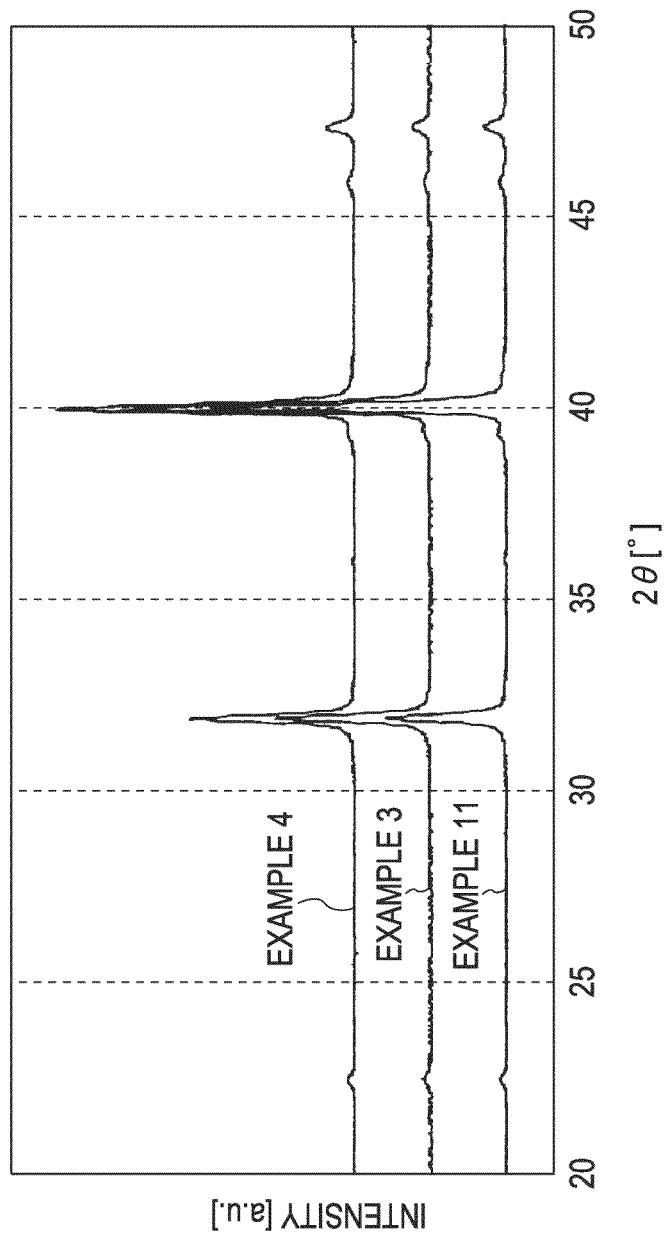

COMPARATIVE EXAMPLE 7
Ti/Ba=1.00      Bi/Ba=3.00

COMPARATIVE EXAMPLE 5
Ti/Ba=1.15      Bi/Ba=3.00

EXAMPLE 8
Ti/Ba=1.17      Bi/Ba=3.44

EXAMPLE 3
Ti/Ba=1.27      Bi/Ba=3.00

EXAMPLE 10
Ti/Ba=1.36      Bi/Ba=4.00

EXAMPLE 9
Ti/Ba=1.45      Bi/Ba=3.44

LIQUID EJECTING HEAD, LIQUID EJECTING APPARATUS, AND PIEZOELECTRIC ELEMENT

The entire disclosure of Japanese Patent Application No. 2011-221358, filed Oct. 5, 2011, and No. 2011-232281, filed Oct. 21, 2011, are expressly incorporated by reference herein.

BACKGROUND

1. Technical Field

The present invention relates to a liquid ejecting head which includes a piezoelectric element having a piezoelectric body layer which is formed of a piezoelectric material and electrodes, and ejects liquid droplets from a nozzle opening, a liquid ejecting apparatus, and the piezoelectric element.

2. Related Art

As a piezoelectric element which is used in a liquid ejecting head, there is a piezoelectric material which presents a function of electrical mechanic transformation, for example, a piezoelectric element which is configured by interposing a piezoelectric body layer which is formed of a crystallized dielectric material between two electrodes. Such a piezoelectric element is mounted on the liquid ejecting head as an actuator unit of, for example, bending and vibrating modes. Here, as a representative example of the liquid ejecting head, for example, there is an ink jet type recording head in which a part of a pressure generation chamber communicating with a nozzle opening which ejects ink droplets is configured using a vibrating plate, the vibrating plate is deformed by the piezoelectric element, ink in the pressure generation chamber is pressurized, and is ejected as ink droplets from the nozzle opening.

In the piezoelectric material which is used as the piezoelectric body layer configuring such a piezoelectric element, high piezoelectric properties are desired, and as the representative example of the piezoelectric material, there is lead zirconate titanate (PZT) (refer to JPA-2001-223404). However, since lead is included in the lead zirconate titanate, a piezoelectric material not including the lead is desired from a viewpoint of environmental problems. Therefore, as the piezoelectric material not including the lead, a bismuth-based piezoelectric material, for example, a piezoelectric element having a bismuth ferric oxide-based ($BiFeO_3$ based) perovskite structure including bismuth and iron is proposed. As a specific example, there is complex oxide which is represented as mixed crystal of $BiFeO_3$ (bismuth ferric oxide) and $BaTiO_3$ (barium titanate) (for example, refer to JP-A-2010-16010 (claim 7, or the like)).

However, the piezoelectric material having the bismuth ferric oxide-based perovskite structure has problems in that cracking easily occurs, and a practical use is difficult compared to a PZT-based material in the related art.

In addition, as a matter of course, such a problem is also present, similarly, even in other liquid ejecting heads which eject liquid droplets other than ink, not only in the ink jet recording head, and in addition, the problem is similarly present in a piezoelectric element which is used for other uses than a liquid ejecting head.

SUMMARY

An advantage of some aspects of the invention is to provide a liquid ejecting head which reduces in the burden on the environment and suppresses the occurrence of cracking, a liquid ejecting apparatus, and a piezoelectric element.

According to an aspect of the invention, there is provided a liquid ejecting head which includes a piezoelectric body layer, and electrodes which are provided in the piezoelectric body layer, in which the piezoelectric body layer is formed of a complex oxide having a perovskite structure including at least bismuth, barium, iron, and titanium, and a mole ratio of the titanium to barium (Ti/Ba) is 1.17 or more, and 1.45 or less.

In the liquid ejecting head, the piezoelectric body layer may suppress an occurrence of cracking of a piezoelectric element when the piezoelectric body layer is formed of complex oxide of which the mole ratio Ti/Ba is 1.17 or more, and 1.45 or less. In addition, since content of lead is suppressed, the burden on the environment may be reduced.

The complex oxide may have a mole ratio of bismuth to barium (Bi/Ba) of 2.3 or more, and 4.0 or less. In this manner, the occurrence of the cracking in the piezoelectric element is further suppressed.

The complex oxide may further include manganese. In this manner, it is possible to make a piezoelectric body layer of which the leaking properties are excellent.

According to another aspect of the invention, there is provided a liquid ejecting apparatus which includes the liquid ejecting head.

In the aspect of the invention, liquid ejecting apparatus a liquid ejecting apparatus may be realized which reduces the burden on the environment, and is highly reliable, since the device includes a piezoelectric element in which the content of lead is little, burden on the environment is reduced, and an occurrence of cracking is suppressed.

According to further another aspect of the invention, there is provided a piezoelectric element which includes a piezoelectric body layer, and electrodes which are provided at the piezoelectric body layer, in which the piezoelectric body layer is formed of a complex oxide having a perovskite structure including at least bismuth, barium, iron, and titanium, and a mole ratio of the titanium to the barium (Ti/Ba) is 1.17 or more, and 1.45 or less.

In the piezoelectric element, the piezoelectric body layer is formed of complex oxide which has a perovskite structure including bismuth, barium, iron, and titanium, an occurrence of cracking may be suppressed by setting Ti/Ba to be 1.17 or more, and 1.45 or less. Further, the burden on the environment may be reduced since content of lead is suppressed.

In the complex oxide, the mole ratio of the bismuth to the barium (Bi/Ba) may be 2.3 or more, and 4.0 or less. In this manner, it is possible to obtain a piezoelectric element in which the occurrence of cracking is suppressed.

The complex oxide further includes manganese. In this manner, it is possible to obtain a piezoelectric body layer of which the leaking properties are excellent.

BRIEF DESCRIPTION OF THE DRAWINGS

The invention will be described with reference to the accompanying drawings, wherein like numbers reference like elements.

FIG. 8 is a graph which illustrates an XRD measurement result of examples.

DESCRIPTION OF EXEMPLARY EMBODIMENTS

First Embodiment

Figure 1:
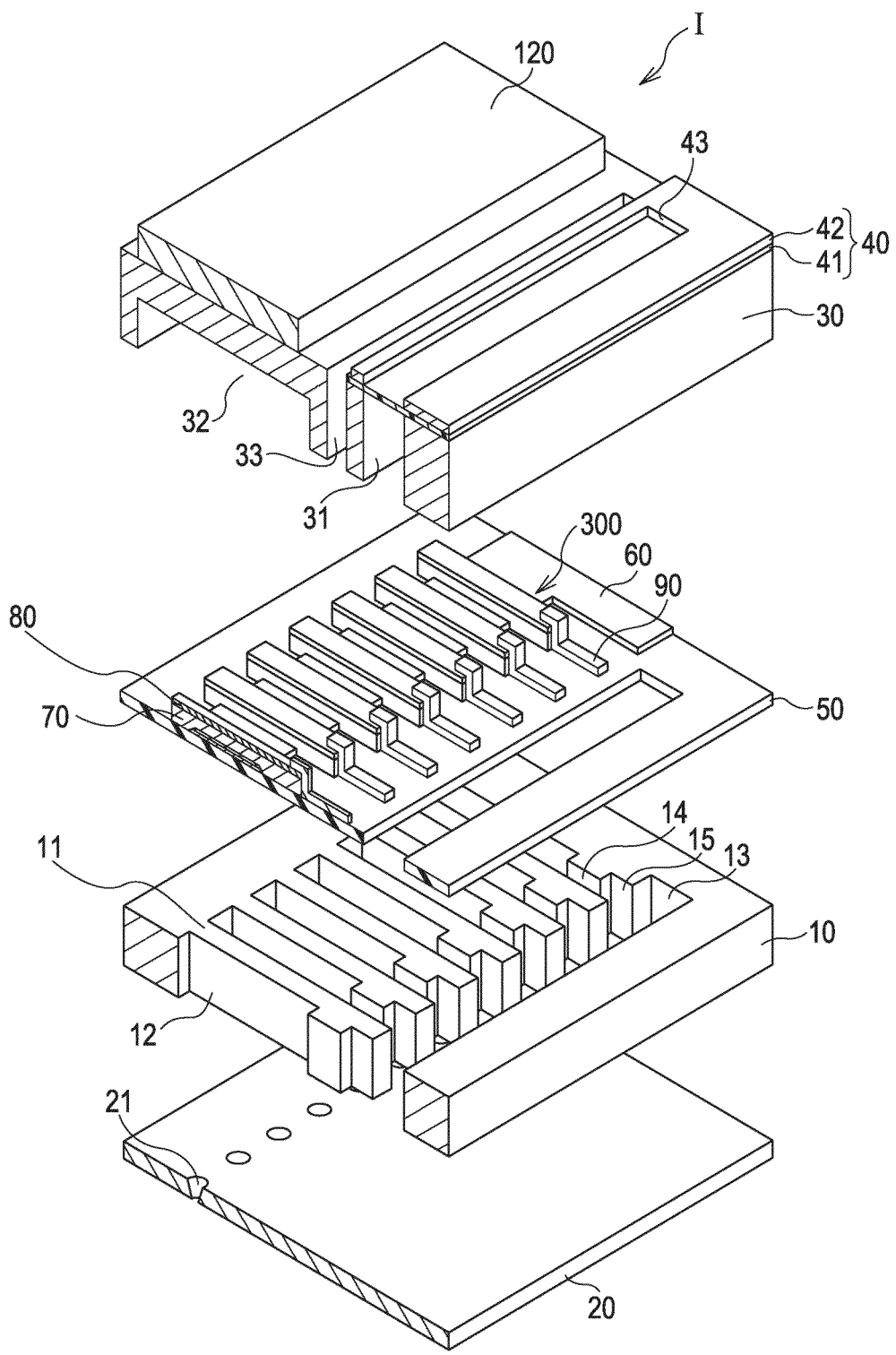
FIG. 1 is an exploded perspective view which illustrates a schematic configuration of a recording head according to a first embodiment.
Figure 2A:
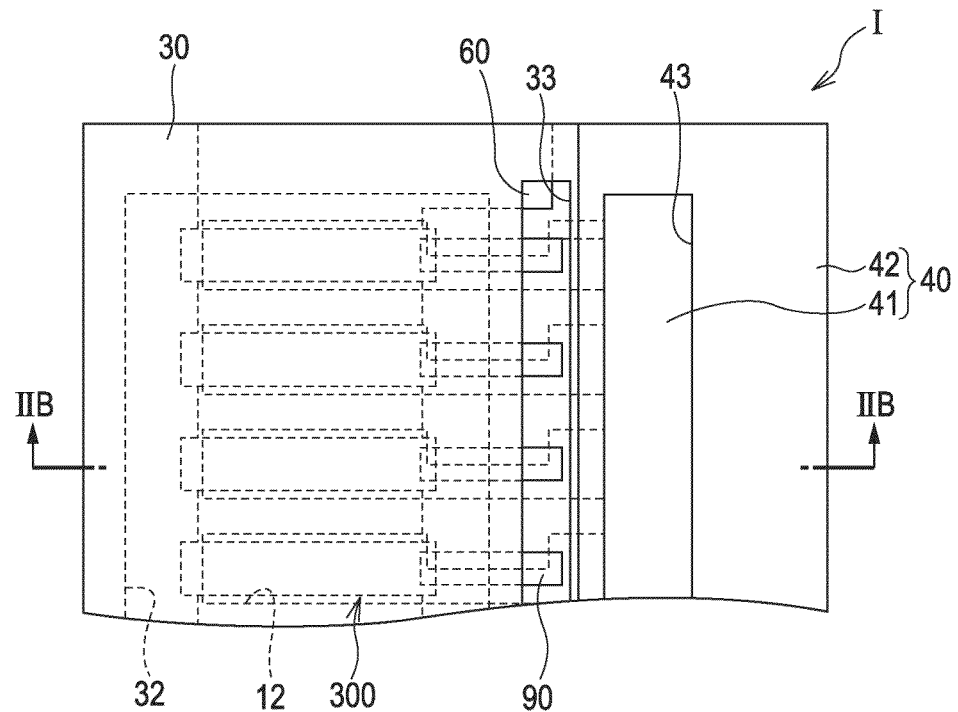
FIG. 2A is a plan view of the recording head according to the first embodiment.
Figure 2B:
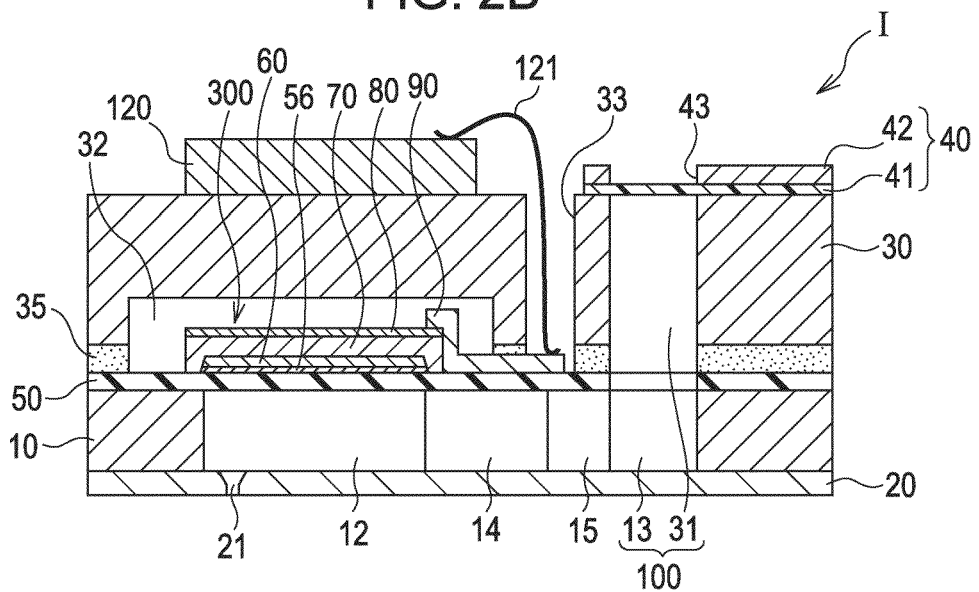
FIG. 2B is a cross-sectional view thereof.

FIG. 1 is an exploded perspective view of an ink jet type recording head which is an example of a liquid ejecting head according to a first embodiment of the invention, FIGS. 2A and 2B are a plan view of FIG. 1, and a cross-sectional view taken along line IIB-IIB thereof.

As illustrated in the figure, according to the embodiment, a channel forming substrate 10 is configured by a silicon single crystalline substrate in the plane direction (110), and the surface on one side thereof is formed by an elastic film 50 of which the thickness is 0.5 to 2.0 μm formed of silicon dioxide, which configures the vibrating plate.

The channel forming substrate 10 is formed with a pressure generation chamber 12 by performing anisotropic etching from the other surface side as the opposite surface to the one surface side. In addition, the pressure generation chamber 12 which is partitioned by a plurality of partition walls 11 is arranged in parallel along the direction in which a plurality of nozzle openings 21 which eject ink of the same color are arranged in parallel. Hereinafter, the direction is referred to as the parallel direction of the pressure generation chamber 12, or the first direction, and the direction which is orthogonal to the direction is referred to as the second direction. In addition, at one end side of the second direction of the pressure generation chamber 12 of the channel forming substrate 10, an ink supply path 14 and a communication path 15 are partitioned by the partition wall 11. In addition, a communication unit 13 which configures part of a manifold 100 which is a common ink chamber (liquid chamber) of each pressure generation chamber 12 is formed at one end of the communication path 15. That is, the channel forming substrate 10 is provided with a liquid channel which is configured by the pressure generation chamber 12, the ink supply path 14, the communication path 15, and the communication unit 13.

The ink supply path 14 communicates with one end side of the pressure generation chamber 12 in the second direction, and has a smaller cross-sectional area than the pressure generation chamber 12. For example, according to the embodiment, the ink supply path 14 is formed with a smaller width than that of the pressure generation chamber 12 by pressing a channel on the pressure generation chamber 12 side between the manifold 100 and each pressure generation chamber 12 in the width direction. In addition, in this manner, according to the embodiment, the ink supply path 14 is formed by pressing the width of the channel from a single side, however, the ink supply path may be formed by pressing the width of the channel from both sides. In addition, the ink supply path may be formed by being pressed in the thickness direction, not pressing the width of the channel. In addition, each communication path 15 communicates with the opposite side to the pressure generation chamber 12 of the ink supply path 14, and has a larger cross-sectional area than that of the ink supply path 14 in the width direction (first direction). According to the embodiment, the communication path 15 is formed so as to have the same cross-sectional area as the pressure generation chamber 12 in the width direction (first direction).

In addition, a nozzle plate 20 on which a nozzle opening 21 which communicates with the ink supply path 14 of each pressure generation chamber 12 in the vicinity of an end portion on the opposite side is drilled is fixed to the channel forming substrate 10 at the opening surface side thereof using an adhesive, a heat bonding film, or the like. In addition, the nozzle plate 20 is formed of, for example, glass ceramics, a silicon single crystalline substrate, stainless steel, or the like.

On the other hand, as illustrated in FIG. 2B, as described above, an elastic film 50 is formed on the opposite side to the opening surface of the channel forming substrate 10, and a adhesion layer 56 which is formed of, for example, titanium oxide with a thickness of approximately 30 to 50 nm, or the like, and improves adherence with the base of a first electrode 60 such as the elastic film 50 is provided on the elastic film 50. According to the embodiment, the titanium oxide is used as the coherence layer 56, however, as a material of the adhesion layer 56, for example, oxide, or nitride including zirconium and aluminum, $SiO_2$, MgO, $CeO_2$, and the like are used, though the material becomes different depending on types of the first electrode 60 and the base thereof. In addition, it is also preferable to provide an insulator film which is formed of zirconium oxide, or the like, on the elastic film 50 as necessary.

Further, on the adhesion layer 56, the first electrode 60, a piezoelectric body layer 70 which is provided at the upper part of the first electrode 60, and is a thin film of which the thickness is 3 μm or less, or preferably 0.3 to 1.5 μm, and a second electrode 80 which is provided at the upper part of the piezoelectric body layer 70 are laminated, and a piezoelectric element 300 as a pressure generation unit which causes a pressure change in the pressure generation chamber 12 is configured. In addition, here, the upper part includes directly above, and a state where other members are interposed therebetween. Here, the piezoelectric element 300 means a portion including the first electrode 60, the piezoelectric body layer 70 and the second electrode 80. In general, it is configured such that any one of the electrodes of the piezoelectric element 300 is set to a common electrode, and the other electrode and the piezoelectric body layer 70 are patterned for each pressure generation chamber 12. According to the embodiment, the first electrode 60 is set to the common electrode of the piezoelectric element 300, and the second electrode 80 is set to an individual electrode of the piezoelectric element 300, however, it is not a problem even if these are reversed due to the circumstances of a driving circuit, or wiring. In addition, in here, the piezoelectric element 300 which is provided to be displaceable is referred to as an actuator. In addition, in the above described example, the elastic film 50, the adhesion layer 56, and the first electrode 60 act as the vibrating plate, however, naturally, they are not limited to this, and for example, it is also possible to make only the first electrode 60 serve as the vibrating plate without providing the elastic film 50 and the adhesion layer 56. In addition, it is also possible to make the piezoelectric element 300 also serve as the vibrating plate itself, in practice.

In addition, the piezoelectric body layer 70 is formed of a complex oxide having a perovskite structure including at least bismuth (Bi), barium (Ba), iron (Fe), and titanium (Ti), and a mole ratio of Titanium to Barium (Ti/Ba) is 1.17 or more, and 1.45 or less. By forming the complex oxide having the above described composition ratio, the piezoelectric body layer 70 becomes further uniform and dense film by being reduced of a particle size thereof. In this manner, it is possible to suppress the occurrence of cracking. In addition, effects of suppressing the occurrence of cracking when the mole ratio of Ti/Ba is less than 1.17, or when it is larger than 1.45 are not confirmed.

In addition, it is preferable that the mole ratio of bismuth to barium (Bi/Ba) of the above described complex oxide be 2.3 or more, and 4.0 or less. In this manner, it is possible to suppress the occurrence of cracking.

Here, as described above, the complex oxide has the perovskite structure, that is, an $ABO_3$ structure, and forms an octahedron by having 12-coordination with oxygen in the A site, and 6-coordination with oxygen in the B site of this structure. In addition, the perovskite structure includes bismuth and barium in the A site, and iron and titanium in the B site.

As the complex oxide according to the embodiment, for example, a ratio of the total molar amount of the bismuth and barium to the total molar amount of the iron and titanium of (Bi+Ba):(Fe+Ti)=1:1 is exemplified, however, as described above, as long as the perovskite structure is obtained, a part of elemental substitution or the like is allowed, including a lattice mismatch, and a deviation in composition due to oxygen deficiency, naturally. In addition, as described above, the mole ratio of titanium to barium (Ti/Ba) is 1.17 or more, and 1.45 or less. In addition, it is preferable that the mole ratio of bismuth to barium (Bi/Ba) be, for example, 2.3 or more, and 4.0 or less. Such a composition of the piezoelectric body layer 70 which is formed of the complex oxide having the perovskite structure can be expressed, for example, using the following general expression. Here, a description of the general expression (1) is of a composition notation based on stoichiometry, and as described above, as long as the perovskite structure is obtained, a part of elemental substitution or the like is allowed, including the lattice mismatch, and the deviation in composition due to the oxygen deficiency, as a matter of course.

$(Bi_{1-a},Ba_a)(Fe_{1-b},Ti_b)O_3$      (1)

In expression (1), in values of a and b, b/a may satisfy 1.17 or more, and 1.45 or less, and (1−a)/a may satisfy 2.3 or more, and 4.0 or less.

In addition, the complex oxide which configures the piezoelectric body layer 70 may include elements other than Bi, Fe, Ba, and Ti in order to improve desired properties. As other elements, for example, Mn, Co are exemplified, and may be an element including any of Mn and Co. As a matter of course, when it is a complex oxide including other elements, it is necessary to have the perovskite structure.

When the piezoelectric body layer 70 includes Mn or Co, Mn or Co is located at the B site, and it is presumed that it is complex oxide having a structure in which Mn or Co substitutes a part of Fe which is present in the B site. For example, when Mn is included, basic characteristics of the complex oxide configuring the piezoelectric body layer 70 are the same as that of the complex oxide having the perovskite structure which is formed of Bi, Fe, Ba, and Ti, however, leak properties are improved. Specifically, occurrence of the leak is suppressed. In addition, similarly to Mn, the leak properties are improved even when Co is included. In addition, Mn and Co are exemplified, however, it is understood that the leak properties are improved even when transition metal elements such as Cr, Ni, Cu, and the like are included, in addition, and when the above described transition metal elements of two or more are included at the same time. These may also configure the piezoelectric body layer 70, and further, other well-known additives may be also included in order to improve the properties.

In the complex oxide, for example, a ratio of the total molar amount of elements in the A site to the total molar amount of elements in the B site, (total molar amount of elements in A site): (total molar amount of elements in B site)=1:1 is exemplified, however, as described above, as long as the perovskite structure is obtained, a part of elemental substitution or the like is allowed, including the lattice mismatch, and the deviation in composition due to the oxygen deficiency, as a matter of course. Such a piezoelectric body layer 70 which is formed of the complex oxide having the perovskite structure including one or more of Mn, Co, and other transition metal element than that, in addition to Bi, Fe, Ba, and Ti, is mixed crystal which is expressed in the following general expression (2). In addition, in the general expression (2), M is a transition metal element such as Mn, Co, Cr, Ni, Cu, or the like. Here, a description of the general expression (2) is composition notation based on stoichiometry, and as described above, as long as the perovskite structure is obtained, the lattice mismatch, and the deviation in composition due to the oxygen deficiency are allowed.

$(Ba_{1-a},Ba_a)(Fe_{1-b-c},M_c,Ti_b)O_3$      (2)

In expression (2), in values of a and b, b/a may satisfy 1.17 or more, and 1.45 or less, and (1−a)/a may satisfy 2.3 or more, and 4.0 or less. In addition, c may 0 or more, and 0.09 or less, and preferably 0.01 or more, and 0.05 or less.

In addition, the piezoelectric body layer 70 may include the other complex oxide having the perovskite structure, for example, Bi (Zn, Ti) $O_3$, (Bi, K) $TiO_3$, (Bi, Na) $TiO_3$, (Li, Na, K) (Ta, Nb) $O_3$.

According to the embodiment, the piezoelectric body layer 70 is formed of the complex oxide having the perovskite structure including bismuth, barium, iron, manganese, and titanium, and is expressed in the following expression (3). However, a description of the general expression (3) is composition notation based on stoichiometry, and as long as the perovskite structure is obtained, element diffusion, the lattice mismatch, and the deviation in composition due to the oxygen deficiency are allowed.

$(Bi_{1-a},Ba_a)(Fe_{1-b-c},Mn_c,Ti_b)O_3$      (3)

In expression (3), in values of a and b, b/a may satisfy 1.17 or more, and 1.45 or less, and (1−a)/a may satisfy 2.3 or more, and 4.0 or less. In addition, c may 0 or more, and 0.09 or less, and preferably 0.01 or more, and 0.05 or less.

In addition, the piezoelectric body layer 70 according to the embodiment may be oriented to any of planes (110), (100), and (111), and is not limited in particular.

A lead electrode 90 formed of, for example, gold (Au) or the like, which is pulled out from the vicinity of an end portion on the ink supply path 14 side, and is extended onto the elastic film 50, or onto the insulator film which is provided as necessary is connected to each of the second electrodes 80 as the individual electrodes of the piezoelectric element 300.

A protecting substrate 30 having a manifold unit 31 which configures at least a part of the manifold 100 is bonded onto the channel forming substrate 10 on which such a piezoelectric element 300 is formed, that is, the first electrode 60, the elastic film 50, or the insulator film film which is provided as necessary, and a lead electrode 90 using an adhesive 35. According to the embodiment, the manifold unit 31 is formed to be stretched in the width direction of the pressure generation chamber 12 passing through the protecting substrate 30 in the thickness direction, and as described above, configures the manifold 100 as a common ink chamber of each pressure generation chamber 12 by communicating with the communication unit 13 of the channel forming substrate 10. In the above described example, the manifold unit 31 and the communication unit 13 serve as the manifold 100, however, as a matter of course, it is not limited to this, and it is also possible to use only the manifold unit 31 as the manifold by dividing the communication unit 13 of the channel forming substrate 10 into a plurality of communication units for each pressure generation chamber 12. In addition, for example, it is also possible to provide only the pressure generation chamber 12 in the channel forming substrate 10, and provide the ink supply path 14 which communicates with the manifold 100, and each pressure generation chamber 12 at a member which is interposed between the channel forming substrate 10 and the protecting substrate 30 (for example, elastic film 50, insulator film which is provided as necessary, or the like).

In addition, a piezoelectric element holding unit 32 having space to a degree that motion of the piezoelectric element 300 is not obstructed, is provided in a region facing the piezoelectric element 300 of the protecting substrate 30. The piezoelectric element holding unit 32 is desired to have space to a degree that motion of the piezoelectric element 300 is not obstructed, and the space may be sealed, or not.

As such a protecting substrate 30, it is preferable to use a material having approximately the same coefficient of thermal expansion as that of the channel forming substrate 10, for example, glass, ceramics, or the like, and according to the embodiment, the protecting substrate is formed using the silicon single crystalline substrate as the same material as the channel forming substrate 10.

In addition, the protecting substrate 30 is provided with a through hole 33 which passes through the protecting substrate 30 in the thickness direction. In addition, the vicinity of the end portion of the lead electrode 90 which is pulled out from each of the piezoelectric elements 300 is provided so as to be exposed to the through hole 33.

In addition, a driving circuit 120 which drives the piezoelectric elements 300 which are provided in parallel is fixed onto the protecting substrate 30. As the driving circuit 120, for example, it is possible to use a circuit board, a semiconductor integrated circuit (IC), or the like. In addition, the driving circuit 120 and the lead electrode 90 are electrically connected to each other through a connection wire 121 which is configured by a conductive wire such as a bonding wire.

In addition, in this manner, a compliance substrate 40 which is configured by a sealing film 41 and a fixing plate 42 is bonded onto such a protecting substrate 30. Here, the sealing film 41 is formed of a material having low rigidity, and flexibility, and one side surface of the manifold unit 31 is sealed by the sealing film 41. In addition, the fixing plate 42 is formed using a relatively hard material. Since a region facing the manifold 100 of the fixing plate 42 becomes an opening portion 43 which is completely removed in the thickness direction, the one side surface of the manifold 100 is sealed using only the flexible sealing film 41.

In such an ink jet type recording head I according to the embodiment, ink is taken in from an ink inlet which is connected to an external ink supply unit (not shown), the ink is filled inside from the manifold 100 to the nozzle opening 21 according to a recording signal from the driving circuit 120, and then a voltage is applied between the respective first electrode 60 and the second electrode 80 corresponding to the pressure generation chamber 12, thereby ejecting ink droplets from the nozzle opening 21 due to a high pressure in each of the pressure generation chambers 12 by deforming the elastic film 50, the first electrode 60, and the piezoelectric body layer 70 to be warped.

Subsequently, an example of a manufacturing method of the ink jet type recording head I according to the embodiment will be described with reference to FIGS. 3A to 7B. In addition, FIGS. 3A to 7B are cross-sectional views which illustrate the pressure generation chamber in the longitudinal direction (second direction).

Figure 3A:
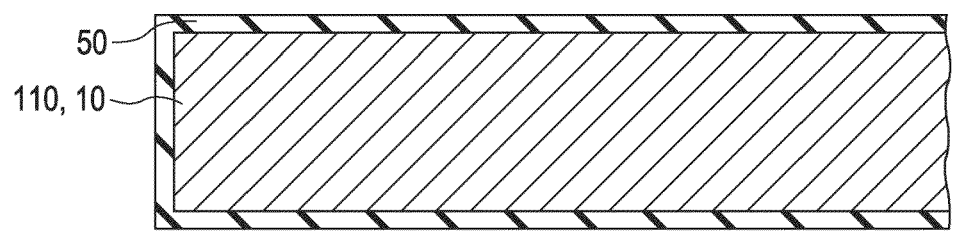
FIGS. 3A and 3B are cross-sectional views which illustrate the manufacturing processes of the recording head according to the first embodiment.
Figure 3B:
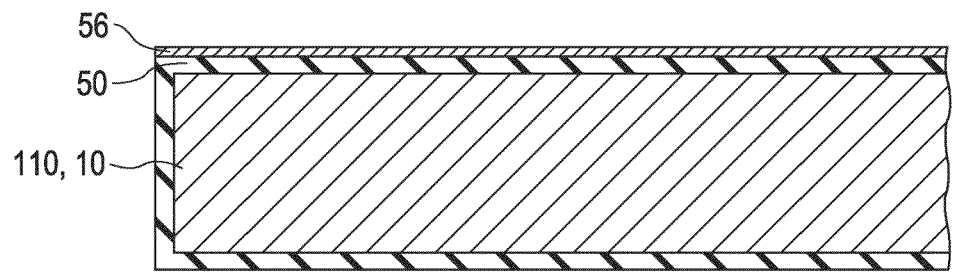

First, as illustrated in FIG. 3A, a silicon dioxide film which is formed of silicon dioxide ($SiO_2$), or the like, configuring the elastic film 50 on the surface of a wafer 110 for channel forming substrate as a silicon wafer is formed using thermal oxidization or the like. Subsequently, as illustrated in FIG. 3B, the adhesion layer 56 which is formed of titanium oxide or the like is formed using a sputtering method, the thermal oxidization method, or the like, on the elastic film 50 (silicon dioxide film).

Figure 4A:
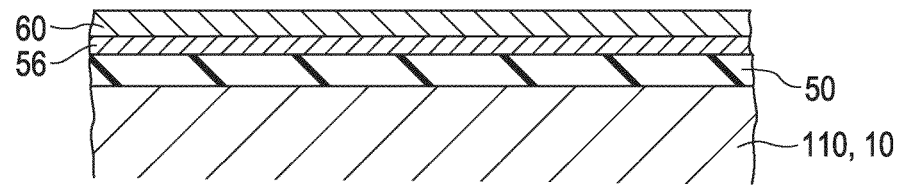
FIGS. 4A, 4B, and 4C are cross-sectional views which illustrate the manufacturing processes of the recording head according to the first embodiment.
Figure 4B:
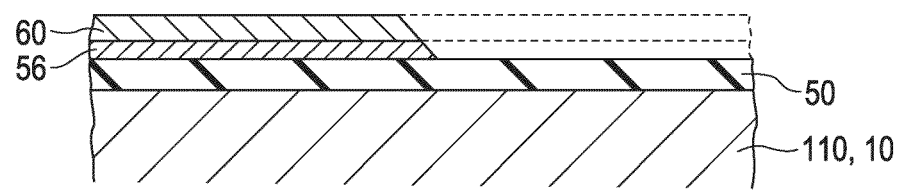

Subsequently, as illustrated in FIG. 4A, the first electrode 60 is formed on the entire surface of the adhesion layer 56. Specifically, the first electrode 60 which is made of, for example, platinum which is formed of platinum, iridium, iridium oxide, or a laminated structure of these is formed on the adhesion layer 56 using the sputtering method, or an evaporation method. Subsequently, as illustrated in FIG. 4B, the side surfaces of the adhesion layer 56 and the first electrode 60 are simultaneously patterned so as to be inclined by having a resist (not shown) of a predetermined shape as a mask, on the first electrode 60.

Subsequently, after separating the resist, the piezoelectric body layer 70 is laminated on the first electrode 60 (and adhesion layer 56).

A manufacturing method of the piezoelectric body layer 70 is not particularly limited, however, for example, it is possible to use a MOD (Metal-Organic Decomposition) method which obtains a piezoelectric body layer (piezoelectric body film) which is formed of metal oxide by applying and drying a solution in which a metal complex including, for example, Bi, Fe, Mn, Ba, and Ti is dissolved and dispersed in a solvent, and is further baked at a high temperature, and a chemical solution method such as a sol-gel method. It is possible to manufacture the piezoelectric body layer 70 using any of a liquid phase method, a solid phase method, and a gas phase method such as the sputtering method, a pulsed laser deposition method (PLD method), a CVD method, an aerosol deposition method, or the like, other than that.

Figure 4C:
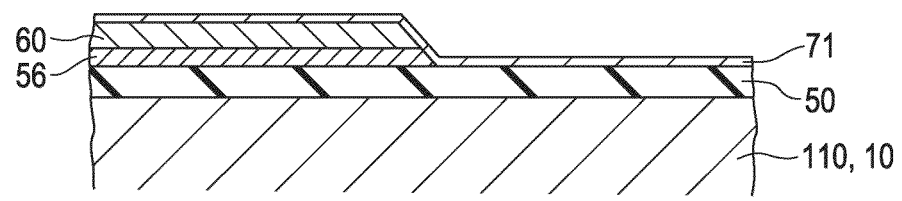

In addition, according to the embodiment, the piezoelectric body layer 70 is manufactured using the chemical solution method such as the MOD method, the sol-gel method, or the like. Specifically, first, as illustrated in FIG. 4C, a piezoelectric body precursor film 71 is formed by applying sol including the metal complex, specifically, Bi, Fe, Mn, Ba, and Ti in a predetermined ratio, or an MOD solution (precursor solution) using a spin coating method, or the like (application process), on the first electrode 60.

According to the embodiment, when the piezoelectric body layer 70 which is formed of the complex oxide having the perovskite structure including bismuth, iron, manganese, barium, and titanium using baking is formed, the precursor solution to be applied is a solution in which a metal complex mixture which can form complex oxide including bismuth, iron, manganese, barium, and titanium is dissolved, or dispersed in an organic solvent by baking. The metal complex mixture is a mixture of the metal complex including one or more metals in the metal configuring the complex oxide, and the metal complex is mixed so that each metal of Bi, Fe, Mn, Ba, and Ti has a desired mole ratio, specifically, the mole ratio of titanium to barium (Ti/Ba) becomes 1.17 or more, and 1.45 or less, and preferably the mole ratio of bismuth to barium (Bi/Ba) becomes 2.3 or more, and 4.0 or less. That is, according to the embodiment, a mixing ratio of the metal complex including Bi, Fe, Mn, Ba, and Ti, respectively, is set to a ratio in which the complex oxide satisfies a desired composition ratio of each metal of Bi, Fe, Mn, Ba, and Ti.

As the metal complex including Bi, Fe, Mn, Ba, and Ti, respectively, it is possible to use, for example, alkoxide, organic acid salt, β-diketone complex, or the like. As a metal complex including Bi, for example, 2-ethylhexanoic acid bismuth, acetic acid bismuth, and the like are exemplified. As a metal complex including Fe, for example, 2-ethylhexanoic ferric acid, ferric acetate, and the like are exemplified. As a metal complex including Mn, for example, 2-ethylhexanoic acid manganese, manganese acetate, and the like are exemplified. As a metal complex including Ba, for example, barium isopropoixde, 2-ethylhexanoic acid barium, barium acetylacetonate, and the like are exemplified. As a metal complex including Ti, for example, titanium isopropoxide, 2-ethylhexanoic acid titanium, titanium (di-1-propoxide) bis (acetylacetonate), and the like are exemplified. As a matter of course, a metal complex including two or more of Bi, Fe, Mn, Ba, and Ti may be used.

In addition, the solvent may be a solvent which dissolves, or disperses the metal complex mixture, and is not particularly limited. For example, there are various solvents such as toluene, xylene, octane, ethylene glycol, 2-metoxyethanol, butanol, ethanol, isopropyl alcohol, acetic acid, and water or the like. As a matter of course, it is also possible to use two or more of these.

Subsequently, the piezoelectric body precursor film 71 is heated at a predetermined temperature (for example, 130 to 200° C.), and is dried for a predetermined time (drying process). Subsequently, the dried piezoelectric body precursor film 71 on which degreasing (a degreasing process) is performed by heating the piezoelectric body precursor film at a predetermined temperature (for example, 350 to 450° C.), and leaving the film for a certain time. The degreasing here is a process in which organic components included in the piezoelectric body precursor film 71 are caused to leave as $NO_2$, $CO_2$, $H_2O$, or the like. An atmospheres of the drying process, or degreasing process is not limited, and it may be an atmosphere, an oxygen atmosphere, or an atmosphere of inert gas. In addition, the application process, drying process, and the degreasing process may be repeated a plurality of times.

Figure 5A:
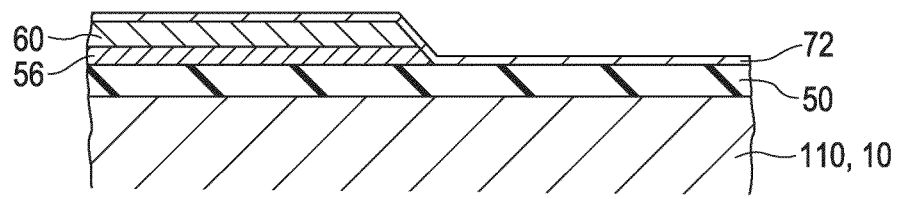
FIGS. 5A and 5B are cross-sectional views which illustrate the manufacturing processes of the recording head according to the first embodiment.

Subsequently, as shown in FIG. 5A, the piezoelectric body precursor film 71 is heated at a predetermined temperature, for example, at approximately 600 to 850° C., is crystallized by being maintained for a predetermined time, for example, for 1 to 10 minutes, thereby forming a piezoelectric body precursor film 72 which is formed of a complex oxide in which bismuth, barium, iron, titanium, and manganese are included, and a mole ratio of titanium to barium (Ti/Ba) is 1.17 or more, and 1.45 or less (baking process). Even in the baking process, the atmosphere is not limited, and it may be the atmosphere, the oxygen atmosphere, and the atmosphere of inert gas.

As a heating unit which is used in the drying process, degreasing process, and baking process, for example, an RTA (Rapid Thermal Annealing) unit which performs heating using irradiating of an infrared lamp, a hot plate, and the like are exemplified.

Figure 5B:
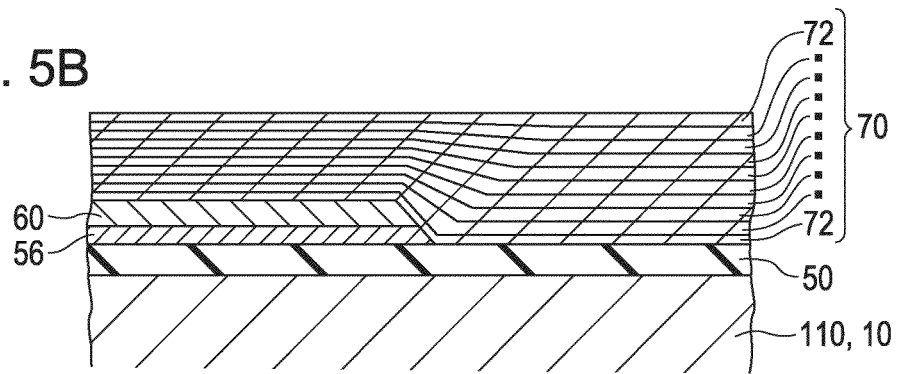

Subsequently, after separating the resist, the plurality of piezoelectric body films 72 are formed by repeating the above described application process, the drying process, and the degreasing process, or the application process, the drying process, the degreasing process, and the baking process a plurality of times according to a desired film thickness, or the like. In this manner, as shown in FIG. 5B, the piezoelectric body layer 70 with a predetermined film thickness which is configured by the plurality of piezoelectric body films 72 is formed. In addition, when forming the plurality of piezoelectric body films 72, the film may be laminated by performing the application process, the drying process, the degreasing process, and the baking process sequentially, however, it is also possible to perform the application process, the drying process, the degreasing process repeatedly, and then perform the baking process of the plurality of layers in a lump. In addition, according to the embodiment, the piezoelectric body films 72 are provided by being laminated, however, it may be only one layer.

Figure 6A:
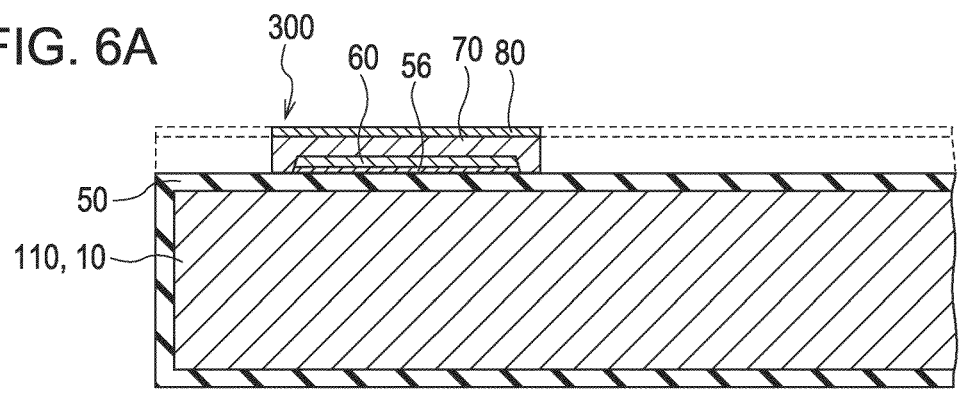
FIGS. 6A, 6B, and 6C are cross-sectional views which illustrate the manufacturing processes of the recording head according to the first embodiment.

After forming the piezoelectric body layer 70 in this manner, as shown in FIG. 6A, the second electrode 80 which is formed of platinum or the like is formed using the sputtering method or the like on the piezoelectric body layer 70, the piezoelectric body layer 70 and the second electrode 80 are patterned at the same time at a region facing each pressure generation chamber 12, and the piezoelectric element 300 which is configured by the first electrode 60, the piezoelectric body layer 70, and the second electrode 80 is formed. In addition, when performing the patterning of the piezoelectric body layer 70 and the second electrode 80, it is possible to pattern them in a lump by performing dry etching through a resist (not shown) which is formed in a predetermined shape. Thereafter, post annealing may be performed in a range of temperature of 600 to 800° C. as necessary. In this manner, it is possible to form a good interface between the piezoelectric body layer 70 and the first electrode 60, or with the second electrode 80, and improve crystallinity of the piezoelectric body layer 70.

Figure 6B:
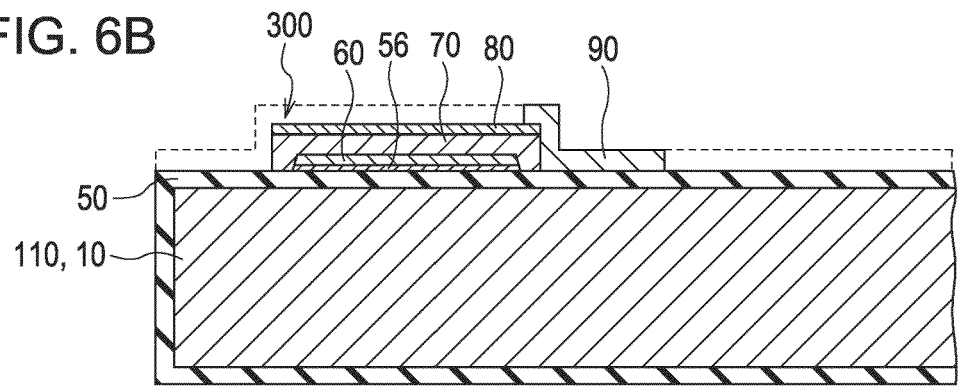

Subsequently, as shown in FIG. 6B, a lead electrode 90 which is formed of, for example, gold (Au) or the like is formed on the entire surface of the wafer 110 for channel forming substrate is formed, and then, each of the piezoelectric elements 300 is patterned through a mask pattern (not shown) which is formed of, for example, a resist or the like.

Figure 6C:
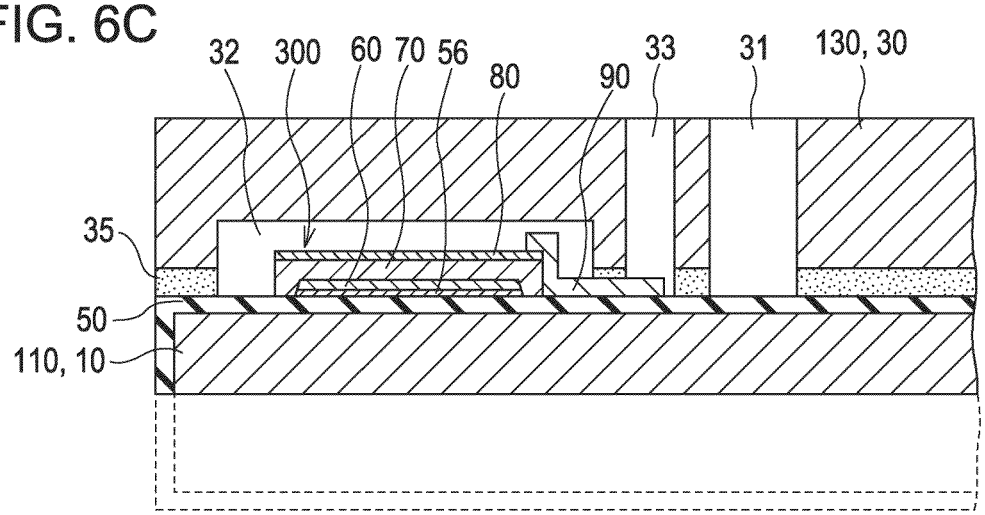

Subsequently, as shown in FIG. 6C, a wafer 130 for protecting substrate which is a silicon wafer, and as the plurality of protecting substrate 30 is bonded onto the piezoelectric element 300 side of the wafer 110 for channel forming substrate through the adhesive 35, and then the wafer 110 for channel forming substrate is made thin so as to have the predetermined thickness.

Figure 7A:
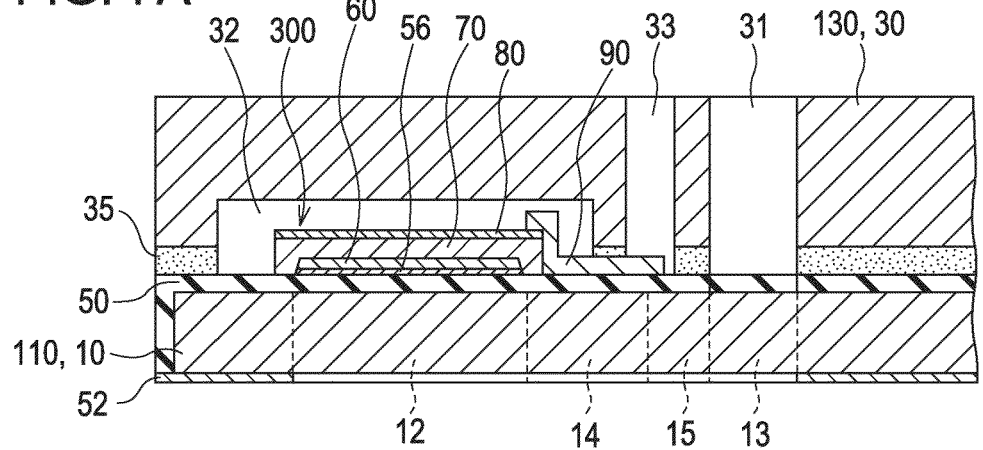
FIGS. 7A and 7B are cross-sectional views which illustrate the manufacturing processes of the recording head according to the first embodiment.

Subsequently, as shown in FIG. 7A, a mask film 52 is newly formed on the wafer 110 for channel forming substrate, and is patterned to a predetermined shape.

Figure 7B:
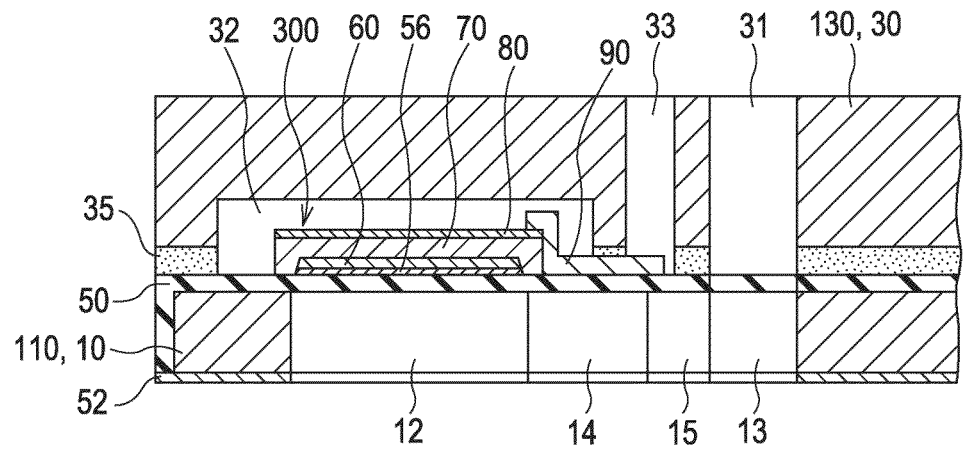

In addition, as shown in FIG. 7B, the pressure generation chamber 12, the communication unit 13, the ink supply path 14, the communication path 15, and the like, corresponding to the piezoelectric element 300 are formed by performing anisotropic etching (wet etching) using alkaline solution such as KOH with respect to the wafer 110 for channel forming substrate through the mask film 52.

Thereafter, unnecessary portions at the outer peripheral edge portions of the wafer 110 for channel forming substrate and the wafer 130 for protecting substrate are removed by being cut using dicing or the like. In addition, the wafer 110 for channel forming substrate, and the wafer 130 for protecting substrate configure an ink jet type recording head I according to the embodiment, by bonding the nozzle plate 20 on which the nozzle opening 21 is drilled after removing the mask film 52 on the opposite surface side, bonding a compliance substrate 40 to the wafer 130 for protecting substrate, and dividing the wafer 110 for channel forming substrate, or the like, into the channel forming substrate 10 having one chip size, as shown in FIG. 1.

Hereinafter, the invention will be further specifically described by illustrating examples. In addition, the invention is not limited to the examples below.

EXAMPLE 1 AND COMPARATIVE EXAMPLES 1 AND 2

First, a silicon dioxide film of which the thickness is 1170 nm is formed using heat oxidization on the surface of the single crystalline silicon substrate which is oriented to (110). Subsequently, a titanium film of which the film thickness is 20 nm is formed on the silicon dioxide film using a RF magnetron sputtering method, and a titanium oxide film is formed using the heat oxidization. Subsequently, the first electrode 60 is formed by forming a platinum film of which the film thickness is 130 nm on the titanium oxide film using the RF magnetron sputtering method.

In addition, an n-octane solution of 2-ethylhexanoic acid bismuth, 2-ethylhexanoic ferric acid, 2-ethylhexanoic acid barium, 2-ethylhexanoic acid titanium, and 2-ethylhexanoic acid manganese is mixed, and the precursor solution is adjusted by making the mole ratio of Bi:Ba:Fe:Ti:Mn be the composition ratio denoted in Table 1.

Subsequently, the precursor solution is dropped on the above substrate on which the titanium oxide film, and the first electrode 60 are formed, and a piezoelectric body precursor film is formed (application process) using a spin coating method by rotating the precursor solution for 5 seconds at 500 rpm, and then rotating the substrate for 20 seconds at 3000 rpm. Next, the plate is placed on the hotplate, and drying is performed for 3 minutes at 180° C. Subsequently, the plate is placed on the hot plate, and degreasing is performed for 3 minutes at 350° C. (degreasing process). After repeatedly performing the processes of an application process, a drying process, and a degreasing process three times, baking is performed at 700° C., and for 5 minutes using an RTA (Rapid Thermal Annealing) device in an oxygen atmosphere (baking process).

Subsequently, the above processes are repeatedly performed 4 times, and the piezoelectric body layer 70 of which the whole thickness is 880 nm is formed by performing the application of 12 times in total.

Thereafter, a platinum film of which the film thickness is 100 nm is formed on the piezoelectric body layer 70 using a DC sputtering method as the second electrode 80, and then the piezoelectric element is formed by performing baking at 700° C., and for 5 minutes using the RTA device under a flow of $O_2$.

EXAMPLE 2 AND COMPARATIVE EXAMPLES 3 TO 5

A piezoelectric element is formed similarly to the Example 1 by setting the mole ratio of Bi:Ba:Fe:Ti:Mn to be the composition ratio denoted in Table 1, except that the piezoelectric body layer 70 of which the thickness is 800 nm is formed by setting the baking temperature to be 750° C.

EXAMPLES 3 TO 10, AND COMPARATIVE EXAMPLE 6

A piezoelectric element is formed similarly to the Example 1 by setting the mole ratio of Bi:Ba:Fe:Ti:Mn to be the composition ratio denoted in Table 1, except that the piezoelectric body layer 70 of which the thickness is 850 nm is formed by setting the baking temperature to be 800° C.

EXAMPLE 11, AND COMPARATIVE EXAMPLES 7 TO 9

A piezoelectric element is formed similarly to the Example 1 by setting the mole ratio of Bi:Ba:Fe:Ti:Mn to be the composition ratio denoted in Table 1, except that the piezoelectric body layer 70 of which the thickness is 1080 nm is formed by setting the baking temperature to be 800° C.

TABLE 1

| | Mole ratio | | | | | Baking temperature (° C.) | Film thickness (nm) |
|---|---|---|---|---|---|---|---|
| | Bi | Ba | Fe | Mn | Ti | | |
| Example 1 | 0.750 | 0.250 | 0.668 | 0.015 | 0.318 | 700 | 880 |
| Example 2 | 0.750 | 0.250 | 0.683 | 0.015 | 0.303 | 750 | 800 |
| Example 3 | 0.750 | 0.250 | 0.668 | 0.015 | 0.318 | 800 | 850 |
| Example 4 | 0.750 | 0.250 | 0.653 | 0.015 | 0.333 | 800 | 850 |
| Example 5 | 0.700 | 0.300 | 0.623 | 0.014 | 0.363 | 800 | 850 |
| Example 6 | 0.725 | 0.275 | 0.645 | 0.015 | 0.340 | 800 | 850 |
| Example 7 | 0.775 | 0.225 | 0.690 | 0.016 | 0.295 | 800 | 850 |
| Example 8 | 0.775 | 0.225 | 0.721 | 0.016 | 0.264 | 800 | 850 |
| Example 9 | 0.775 | 0.225 | 0.659 | 0.016 | 0.326 | 800 | 850 |
| Example 10 | 0.800 | 0.220 | 0.712 | 0.016 | 0.272 | 800 | 850 |
| Example 11 | 0.750 | 0.250 | 0.683 | 0.015 | 0.303 | 800 | 1080 |
| Comparative Example 1 | 0.750 | 0.250 | 0.713 | 0.038 | 0.250 | 700 | 880 |
| Comparative Example 2 | 0.750 | 0.250 | 0.578 | 0.015 | 0.408 | 700 | 880 |
| Comparative Example 3 | 0.750 | 0.250 | 0.713 | 0.038 | 0.250 | 750 | 800 |
| Comparative Example 4 | 0.750 | 0.250 | 0.690 | 0.038 | 0.273 | 750 | 800 |
| Comparative Example 5 | 0.750 | 0.250 | 0.675 | 0.038 | 0.288 | 750 | 800 |
| Comparative Example 6 | 0.750 | 0.250 | 0.578 | 0.015 | 0.408 | 800 | 850 |
| Comparative Example 7 | 0.750 | 0.250 | 0.713 | 0.038 | 0.250 | 800 | 1080 |
| Comparative Example 8 | 0.750 | 0.250 | 0.698 | 0.038 | 0.265 | 800 | 1080 |
| Comparative Example 9 | 0.750 | 0.250 | 0.675 | 0.038 | 0.288 | 800 | 1080 |

TEST EXAMPLE 1

Figure 9:
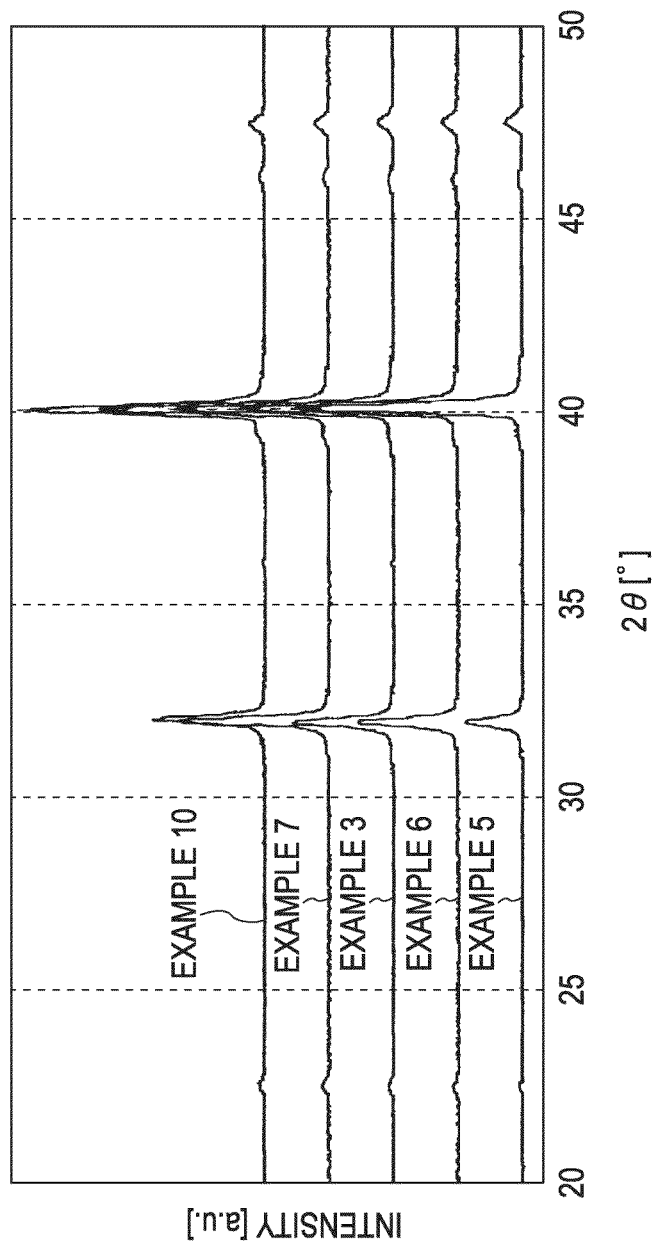
FIG. 9 is a graph which illustrates the XRD measurement result of examples.

With respect to the piezoelectric elements in each example, and each Comparative Example, "D8 Discover" made by Bruker Corporation is used, a CuK α ray is used as an X-ray source, and an X-ray diffraction pattern of the piezoelectric body layer is obtained in a room temperature. Examples of the X-ray diffraction pattern as a diagram which denotes a correlation between a diffraction intensity and a diffraction angle 2θ in the example are illustrated in FIGS. 8 and 9.

As a result, in all of the respect examples and Comparative Examples, a peak due to the perovskite structure, and a peak which is derived from the substrate are observed. Specifically, a peak due to the piezoelectric body layer (100) which is formed by a single phase perovskite structure is confirmed in the vicinity of 23°, a peak due to the silicon substrate (110) is confirmed in the vicinity of 32°, and a peak of (111) due to the platinum is confirmed in the vicinity of 40°. That is, as shown in FIG. 8, heterogeneous phase is not confirmed even when the ratio of iron (Fe) to titanium (Ti) is changed, and as shown in FIG. 9, the heterogeneous phase is not confirmed even when the ratio of bismuth (Bi) to barium (Ba) is changed, and it is confirmed that any of the piezoelectric body layers is the perovskite single phase.

TEST EXAMPLE 2

Figure 10A:
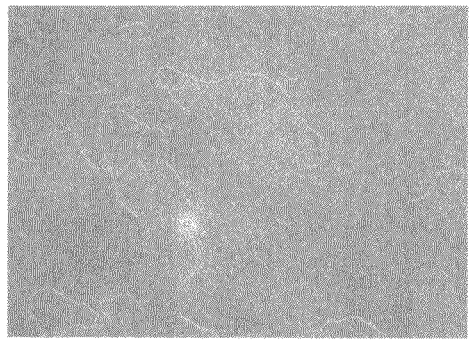
FIGS. 10A to 10F are photographs of the surfaces of the piezoelectric body layer in each example and each comparative example which are observed using a metallographic microscope.
Figure 10B:
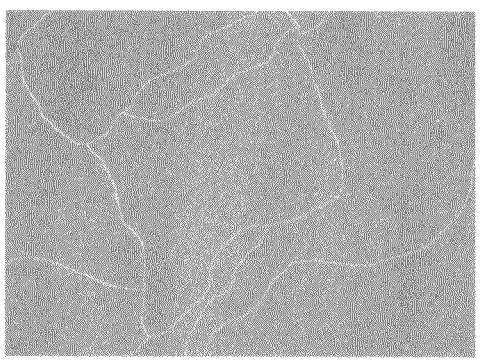
Figure 10C:
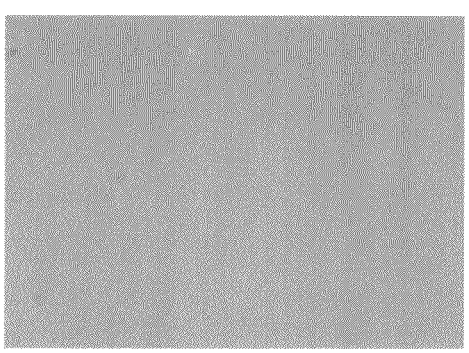
Figure 10D:
Figure 10E:
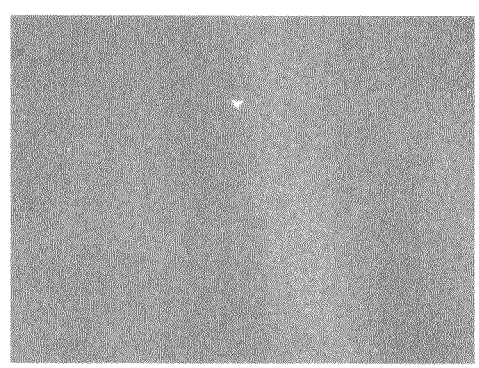
Figure 10F:
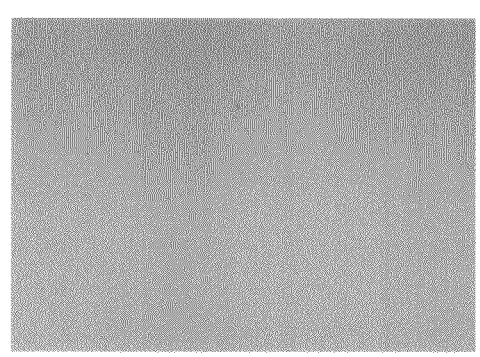

In the Examples 1 to 11, and Comparative Examples 1 to 9, an occurrence of cracking in 5 days after forming the piezoelectric body layer 70 is confirmed with respect to the piezoelectric body layer 70 in a state where the second electrode 80 is not formed. The surface of the piezoelectric body layer is observed using a metallographic microscope of 500 times. The result is shown in Table 2. In addition, as an example of the result, a result of the Comparative Example 7 is shown in FIG. 10A, a result of the Comparative Example 5 is shown in FIG. 10B, a result of the Example 8 is shown in FIG. 10C, a result of the Example 3 is shown in FIG. 10D, a result of the Example 10 is shown in FIG. 10E, and a result of the Example 9 is shown in FIG. 10F.

TABLE 2

|  | Mole ratio (Ti/Ba) | Cracking |
|---|---|---|
| Example 1 | 1.27 | None |
| Example 2 | 1.21 | None |
| Example 3 | 1.27 | None |
| Example 4 | 1.33 | None |
| Example 5 | 1.21 | None |
| Example 6 | 1.24 | None |
| Example 7 | 1.31 | None |
| Example 8 | 1.17 | None |
| Example 9 | 1.45 | None |
| Example 10 | 1.36 | None |
| Example 11 | 1.21 | None |
| Comparative Example 1 | 1.00 | None |
| Comparative Example 2 | 1.63 | Present |
| Comparative Example 3 | 1.00 | Present |
| Comparative Example 4 | 1.09 | Present |
| Comparative Example 5 | 1.15 | Present |
| Comparative Example 6 | 1.63 | Present |
| Comparative Example 7 | 1.00 | Present |
| Comparative Example 8 | 1.06 | Present |
| Comparative Example 9 | 1.15 | Present |

As a result, in the Examples 1 to 11 of which the mole ratio Ti/Ba is 1.17 or more, and 1.45 or less, the occurrence of cracking is not confirmed even when the film thickness thereof is 800 nm or more which is relatively high.

In contrast to this, in the Comparative Examples 1, 3 to 5, and 7 to 9 of which the mole ratio Ti/Ba is 1.00 to 1.15, the cracking occurs. In addition, similarly, in the Comparative Examples 2 and 6 of which the mole ratio Ti/Ba is 1.63 or more, the cracking occurs.

As described above, it is understood that the occurrence of cracking is suppressed when the mole ratio Ti/Ba is 1.17 or more, and 1.45 or less.

Another Embodiment

Hitherto, an embodiment of the invention has been described, however, the basic configuration of the invention is not limited to the above descriptions. For example, in the above described embodiment, as the channel forming substrate 10, the silicon single crystalline substrate has been exemplified, however, it is not particularly limited to this. For example, an SOI substrate, or a material such as glass may be used as the channel forming substrate 10.

Further, in the above described embodiment, the piezoelectric element 300 in which the first electrode 60, the piezoelectric body layer 70, and the second electrode 80 are sequentially laminated on the substrate (channel forming substrate 10) is exemplified, however, it is not particularly limited to this, and it is also possible to apply the invention to, for example, a piezoelectric element of a longitudinal vibration type in which a piezoelectric material and a material forming electrodes are alternately laminated, and are expanded and contracted in the axis direction.

Figure 11:
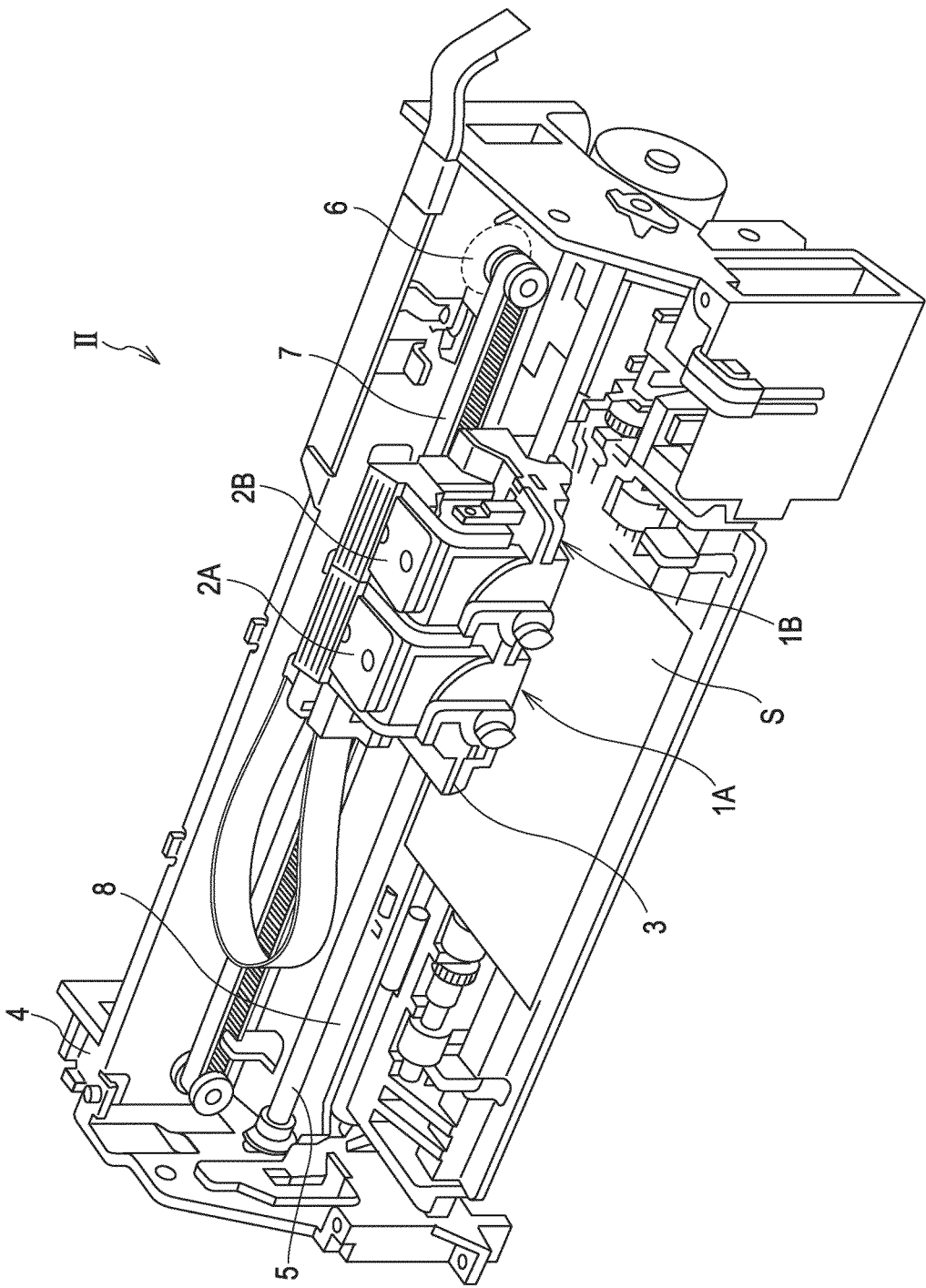
FIG. 11 is a diagram which illustrates a schematic configuration of a recording device according to an embodiment of the invention.

In addition, the ink jet type recording head according to the embodiment configures a part of a recording head unit which includes ink channels communicating with an ink cartridge or the like, and are mounted on a ink jet type recording device. FIG. 11 is a schematic diagram which illustrates an example of the ink jet type recording device.

In the ink jet type recording device II in FIG. 11, recording head units 1A and 1B including an ink jet type recording head I are provided with detachable cartridges 2A and 2B which configure an ink supply unit, and a carriage 3 which is mounted with the recording head units 1A and 1B is provided at a carriage axis 5 which is attached to a main body 4 of the device to be able to move in the axis direction. The recording head units 1A and 1B are, for example, assumed to eject a black ink composition, and a color ink composition, respectively.

In addition, the carriage 3 which is mounted with the recording head units 1A and 1B is moved along the carriage axis 5 when a driving force of a driving motor 6 is transmitted to the carriage 3 through a plurality of toothed wheels and a timing belt 7. On the other hand, a platen 8 is provided at the main body 4 of the device along the carriage axis 5, and a recording sheet S as a recording medium such as a sheet which is fed using a not shown paper feed roller, or the like, is transported by being wound in the platen 8.

In addition, in the above described embodiment, the ink jet type recording head has been described as an example of the liquid ejecting head, however, the invention is to be widely applied to the entire liquid ejecting head, and as a matter of course, it is also possible to apply the invention to a liquid ejecting head which ejects liquid other than ink. As other liquid ejecting heads, for example, there are various recording heads which are used in an image recording device such as a printer, a color material ejecting head which is used when manufacturing a color filter of a liquid crystal display, or the like, an ejecting head of an electrode material which is used when forming electrodes of an organic EL display, FED (field emission display), an ejecting head of a bioorganic matter which is used when manufacturing a biochip, or the like.

In addition, the piezoelectric element according to the embodiment is not limited to a piezoelectric element which is used in the liquid ejecting head, and can be applied to other devices. As the other devices, for example, there are a supersonic wave device such as a supersonic wave transmitter, an ultrasonic motor, a temperature electric converter, a pressure electric converter, a ferroelectric transistor, a piezoelectric transformer, and filters such as a shutoff filter of harmful rays such as infrared rays, or the like, an optical filter in which a photonic crystal effect due to a formation of quantum dots is used, an optical filter of a thin film in which an optical interference is used, or the like. In addition, the invention can also be applied to a piezoelectric element which is used as a sensor, a piezoelectric element which is used as a ferroelectric memory. As the sensor in which the piezoelectric element is used, for example, there are an infrared sensor, an ultrasonic sensor, a heat-sensitive sensor, a pressure sensor, a pyroelectric sensor, a gyro sensor (angular velocity sensor), or the like.

What is claimed is:

1. A liquid ejecting head comprising:
a piezoelectric body layer; and
electrodes which are provided in the piezoelectric body layer,
wherein the piezoelectric body layer is formed of a complex oxide having a perovskite structure including at least bismuth, barium, iron, titanium, and manganese,
wherein a mole ratio of titanium to barium (Ti/Ba) is 1.17 or more, and 1.45 or less; and
a mole ratio of titanium to manganese (Ti/Mn) is 16.50 or more, and 25.93 or less.

2. The liquid ejecting head according to claim 1,
wherein the mole ratio of bismuth to barium (Bi/Ba) in the complex oxide is 2.3 or more, and 4.0 or less.

3. A liquid ejecting apparatus according to claim 1 comprising:
a liquid ejecting head.

4. A piezoelectric element comprising:
a piezoelectric body layer; and
electrodes which are provided at the piezoelectric body layer,
wherein the piezoelectric body layer is formed of a complex oxide with a perovskite structure including at least bismuth, barium, iron, and titanium, and manganese,
wherein a mole ratio of titanium to barium (Ti/Ba) is 1.17 or more, and 1.45 or less; and
a mole ratio of titanium to manganese (Ti/Mn) is 16.50 or more, and 25.93 or less.

* * * * *